(12) United States Patent
Siebert et al.

(10) Patent No.: US 9,257,243 B2
(45) Date of Patent: Feb. 9, 2016

(54) OPERATING DEVICE, IN PARTICULAR FOR A VEHICLE COMPONENT

(75) Inventors: Rainer Siebert, Erwitte (DE); Bernd Stich, Büren (DE); Holger Kleine-Hollenhorst, Lippstadt (DE)

(73) Assignee: Behr-Hella Thermocontrol GMBH, Stuttgart (DE)

( * ) Notice: Subject to any disclaimer, the term of this patent is extended or adjusted under 35 U.S.C. 154(b) by 110 days.

(21) Appl. No.: 14/112,603

(22) PCT Filed: Apr. 17, 2012

(86) PCT No.: PCT/EP2012/056962
§ 371 (c)(1),
(2), (4) Date: Jan. 6, 2014

(87) PCT Pub. No.: WO2012/143339
PCT Pub. Date: Oct. 26, 2012

(65) Prior Publication Data
US 2014/0124350 A1    May 8, 2014

(30) Foreign Application Priority Data

Apr. 20, 2011 (DE) .......................... 10 2011 018 269

(51) Int. Cl.
*H01H 13/14*    (2006.01)
*H01H 9/54*    (2006.01)
(Continued)

(52) U.S. Cl.
CPC ............ *H01H 9/547* (2013.01); *H03K 17/962* (2013.01); *H03K 17/965* (2013.01); *H03K 2017/9602* (2013.01); *H03K 2217/96076* (2013.01); *H03K 2217/960755* (2013.01)

(58) Field of Classification Search
CPC ... H03K 17/962; H03K 17/945; H03K 17/96; H03K 17/975; H03K 2217/94073; H01H 9/547; H01H 2239/006
USPC .................................................. 200/520, 600
See application file for complete search history.

(56) References Cited

U.S. PATENT DOCUMENTS 7,564,247 B2 *  7/2009  Born et al. ..................... 324/658
7,674,993 B2 *  3/2010  Jeitner et al. .................. 200/600
(Continued)

FOREIGN PATENT DOCUMENTS

WO    2007/041780    2/2007
WO    2011/032898    3/2011

OTHER PUBLICATIONS

WO2011032898 equivalent to EP 2010063340, Santarossa et al., Mar. 2011. Machine translation and Figures.*

(Continued)

*Primary Examiner* — Kyung Lee
(74) *Attorney, Agent, or Firm* — Renner, Otto, Boisselle & Sklar, LLP

(57) ABSTRACT

The operating device (10), in particular for a vehicle component or generally for a human/machine interface, is provided with at least one pushbutton (28), which has a depressible pushbutton element (26). In addition, the operating device (10) has a guide element (18), which defines an accommodating area (24) in which the pushbutton element (26) is at least partially accommodated and in which the pushbutton element (26) is guided, and a capacitive proximity sensor (36) with an electrode (34) for detecting an object approaching the pushbutton element (26), in particular a hand or a finger of a hand. The electrode (34) is arranged outside the accommodating area (24) of the guide element (18).

9 Claims, 2 Drawing Sheets

Figure 1:
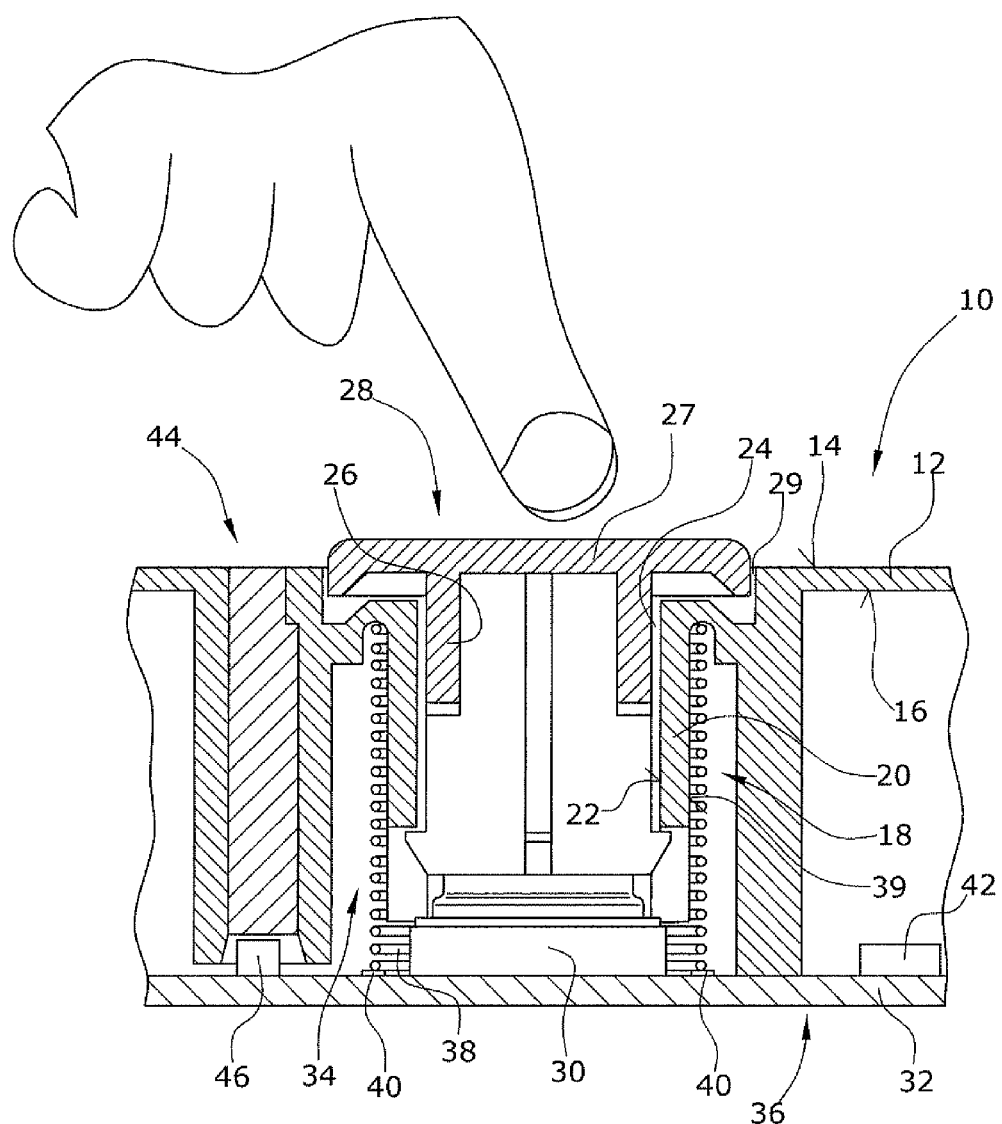

(51) Int. Cl.
*H03K 17/96* (2006.01)
*H03K 17/965* (2006.01)

(56) References Cited

U.S. PATENT DOCUMENTS 7,989,725 B2 * 8/2011 Boddie et al. ................ 200/600
8,173,925 B2 * 5/2012 Wustenbecker ............. 200/600
8,354,606 B2 * 1/2013 Yokoyama et al. ........... 200/600
2009/0090605 A1 * 4/2009 Arione et al. ................. 200/314
2010/0059349 A1 * 3/2010 Wuestenbecker ............. 200/314

OTHER PUBLICATIONS

International Search Report for corresponding patent application No. PCT/EP2012/056962 dated Jul. 6, 2012.

* cited by examiner

OPERATING DEVICE, IN PARTICULAR FOR A VEHICLE COMPONENT

The invention relates to an operating device, in particular for a vehicle component or generally for a human/machine interface.

For a large variety of electrical appliances, operating devices exist for manually setting and changing the operating parameters of the appliance. Particularly in the automotive field and, e.g., also in other electronic devices (PDA, cell phones, tablet computers, palmtops and laptops), it can be advantageous if, for instance, a menu for the setting options is visually represented on a display as soon as a user approaches the operating device e.g. by a finger of his/her hand. In this context, it is known to use capacitive proximity sensors which comprise electrodes serving for capacitive detection of an object, e.g. a hand or a finger of a hand, that is approaching e.g. a pushbutton. The capacitively acting electrode of such a proximity sensor should be arranged as close as possible to the front side or on the front side of a pushbutton body so as to be able to detect the approach of an object in a reliable manner. An example of an operating pushbutton having a capacitive proximity sensor arranged in it is described in DE-A 10 2006 035 837. Herein, the electrode is formed as a spring element arranged in abutment on the inner side of the front wall of the pushbutton body. Thus, when the pushbutton body is pressed, also the force of the spring element has to be overcome, which inevitably will have an influence on the haptics.

Further examples of operating elements with proximity sensorics wherein the proximity sensor is arranged within a depressible pushbutton body, are found in DE-A-10 2007 025 564 and EP-A-1 739 839. Also in the examples described in these documents, the sensorics has an effect on the force required for pressing the pushbuttons. A further difficulty of the above described known pushbuttons with capacitive proximity sensorics resides in that a backlighting of the pushbutton body and respectively of its front wall is possible only with restrictions because, in this respect, the built-in components of the proximity sensorics will cause restrictions with respect to a uniform illumination of the pushbutton body.

Further examples of proximity sensorics are described in DE-A-10 2008 031 366, DE-A-34 29 338, DE-A-10 2005 025 021 and WO-A-2010/006 972.

Finally, from DE-U-20 2005 002 157, for realizing capacitive proximity sensorics in a manually operable, fixed touch field (touch screen or panel), it is known to arrange, between the fixed touch field and a carrier plate located at a distance below the touch field, a helical, electrically conductive spring having a widening configuration toward the touch field, which spring is arranged in a compressed state between the touch field and the carrier plate and forms the capacitive electrode of the proximity sensor. Since the touch field does not perform any movements, the spring will thus not be able to have an effect on the haptics.

It is an object of the invention to provide an operating device, in particular for a vehicle component or generally for a human/machine interface with capacitive proximity sensorics, wherein the capacitive proximity sensorics shall have no effect on the haptics of a depressible pushbutton of the operating device.

According to the invention, for achieving the above object, there is proposed an operating device, in particular for a vehicle component or generally for a human/machine interface, wherein said operating device comprises a front panel having a front side and a rear side, at least one pushbutton having a pushbutton body depressible from the front side of the front panel, a guide element arranged on and/or behind the rear side of the front panel and defining an accommodating area in which the pushbutton body is at least partially accommodated and in which the pushbutton body is guided, and a capacitive proximity sensor comprising an electrode arranged on and/or behind the rear side of the front panel, for detecting an object approaching the pushbutton body, in particular a hand or a finger of a hand.

In the above operating device, it is provided, according to the invention, that the electrode is arranged outside the guiding region of the accommodating area.

The operating device according to the invention comprises at least one pushbutton having a depressible pushbutton body. This pushbutton body is at least partially arranged with the accommodating area of a guide element of the operating device, wherein, during the press-down movement, the pushbutton body will be guided within the accommodating area. The operating device according to the invention further comprises a capacitive proximity sensor having at least one electrode for detecting an object approaching the pushbutton body. In particular, this object is the hand or a finger of the hand of a person operating the operating device.

According to the invention, in such an operating device, said at least one electrode is now arranged outside the accommodating area of the guide element and, thus, also outside the pushbutton body. Thereby, it is accomplished that the electrode will not be subjected to any mechanical or similar influences or changes when the pushbutton is pressed. In this manner, the haptic properties of the pushbutton are not dependent on mechanical components of the capacitive proximity sensorics and on the integration of the latter in, e.g., the operating panel of the operating device.

The arrangement of the electrode of the capacitive proximity sensor outside the accommodating area of the guide element, as proposed according to the invention, ultimately means that the electrode is arranged between the inner side of the guide element that is facing toward the accommodating area, and the outer side of the guide element, i.e., for instance, that the electrode is integrated into the wall of the guide element, or is arranged outside the guide element as well as adjacent thereto and/or adjoining thereto. Particularly, the electrode extends outside around the guide element.

According to a further advantageous embodiment of the invention, it can be provided that the operating device is equipped with a front panel having a front side and a rear side, wherein said front panel is formed with an accommodating opening for the pushbutton body of said at least one pushbutton, and wherein, at the rear side of the front panel, the guide element projects from said accommodating opening by a length and the electrode extends all the way along the length of the guide element and preferably beyond the guide element.

The electrode is electrically connected to an evaluation unit which is operative to output an output signal indicating the approach of an object (a hand or a finger of a hand) toward the pushbutton body. For this purpose, the electrode can contact e.g. a connector field of a carrier plate (particularly a circuit board) of the operating device. It is suitable if the electrode is formed as a spring element, particularly as a helical spring, by which the electrode is held in a compressed state between the carrier plate and a front panel of the operating device. In this arrangement, the spring preload is effective to provide the permanent electrical contacting and mechanical fixing of the electrode also in situations of mechanical vibrations and shocks to which the operating device may happen to be exposed. Possible alternative realizations of the electrode are e.g. electrically conductive strip elements, part- or full sleeve elements or also electrically conductive films. Further, the wall of the guide element itself could be electrically conductive (e.g. by integration of electrically conducting materials or also metalized plastics).

For converting the press-down movement of the pushbutton into an electric (switch) signal, the pushbutton body is operatively connected to a switch. The switch can take a large variety of forms. Thus, for instance, the switch can be realized as a switching mat, a short-stroke switch, a contactless switch and the like.

Figure 2:
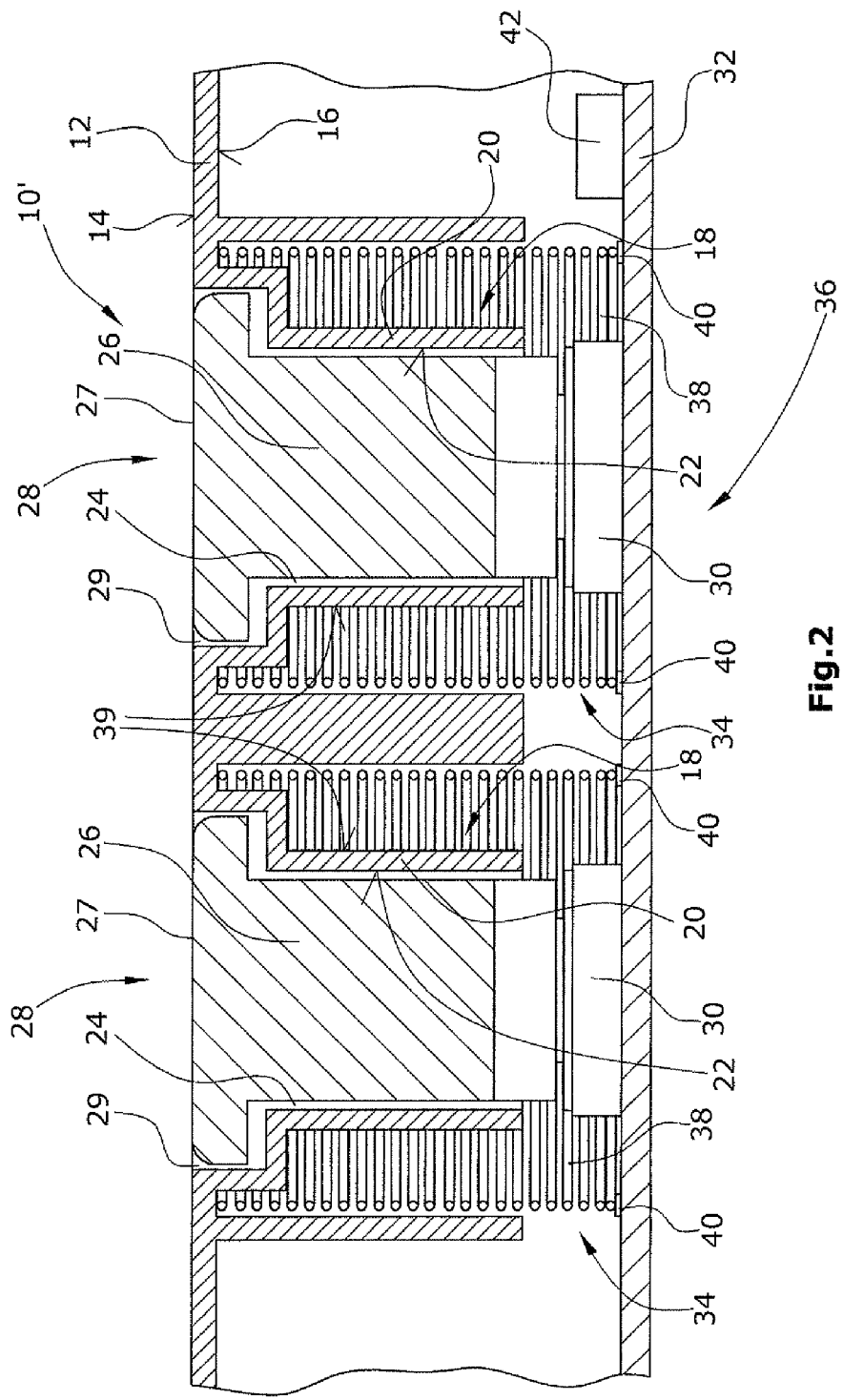

The invention will be explained in greater detail hereunder by way of two embodiments and with reference to the drawings. In the figures of the drawings, the following is shown:

FIG. 1 is a sectional view of a pushbutton of an operating device according to a first embodiment, and FIG. 2 is a sectional view of two mutually adjacent pushbuttons of an operating device according to a second embodiment.

In FIG. 1, there is illustrated that part of an operating device 10 which is of relevance for the invention. The operating device 10 comprises a front panel or cover 12 having a front side 14 and a rear side 16. From said rear side 16, a guide element 18 extends which comprises e.g. a surrounding wall 20. The inner side 22 of wall 20 of guide element 18 forms an accommodating area 24 for the pushbutton body 26, said pushbutton body comprising a front wall 27 of a depressible pushbutton 28. The pushbutton 28 and respectively its front wall 27 are arranged in an accommodating opening 29 in said front panel or cover 12. The pushbutton body 26 is guided in the accommodating area 24 of guide element 18 and can be pressed down, while being operatively connected to a switch 30 arranged on a carrier plate 32 facing toward the rear side 16 of front panel 12.

Extending around guide element 18 is an electrode 34 which forms a part of a capacitive proximity sensor 36. Electrode 34 is designed as a helical, electrically conductive spring 38 supported between the rear side 16 of front panel 12 and the carrier plate 32, and surrounding the guide element 18 on the outer side 39 of the latter. On carrier plate 32, there is arranged an e.g. annular contact field 40 which is abutted by said electrically conductive spring 38. Contact field 40 is electrically connected—via a conductive path, not shown— to an evaluation unit 42 of the capacitive proximity sensor 36 which is operative for outputting an output signal indicating the approach of an object to the pushbutton body 26.

Further, the operating device 10 comprises a function feedback indicator device 44, assigned to pushbutton 28, by which, with the aid of a light source 46, the actuation of pushbutton 28 and thus the activation of the function selected via pushbutton 28 will be indicated.

As evident from the above description and from FIG. 1, the capacitive sensing of e.g. a hand or a finger of a hand is performed via the electrode 34 which is arranged outside of both the pushbutton body 26 and the guide element 18, and thus via signal transmission provided outside of the pushbutton guidance, with the aid of an electrically conductive metallic spring or with the aid of a partially or fully metalized and spring-biased plastic body or with the aid of a resilient punched metallic member with spring bias. In this arrangement, the spring bias is effective to provide the permanent electrical contacting and mechanical fixing of the electrode 34 also in case of mechanical shocks or vibrations.

Optionally, the electrically conductive partial metallization of the guide element 18 can also be achieved by partial application of conductive polymer substances on the guide element 18 which is preferably made of plastic. The mechanical contacting of the electrode 34 at the front panel 12 is effected by abutment of the electrode 34 on the rear side 16 of front panel 12, while the electrical and mechanical contacting of the electrode toward the carrier plate 32 is effected via the contact field 40 in the form of e.g. a carbon, gold or metallic pad or the like. The electrical contacting of the electrode 34 (particularly spring 38) on the carrier plate 32 can be full-faced or partial. In case that switching mats are used, the contacting of the electrode 34 is realized via partial openings (at one, two or more positions) of the switching mat through which the electrode 34 extends to the carrier plate 32. The front wall 27 of pushbutton body 26 should cover the guide element 18 and the electrode 34 laterally toward the outside.

FIG. 2 is a longitudinal sectional view of two mutually adjacent pushbuttons 28 of an operating device 10' of an alternative design. As far as the individual components of this operating device 10' are functionally equivalent or identical to the individual components of the operating device 10 according to FIG. 1, they are provided with the same reference numerals also in FIG. 2.

A difference between the operating devices 10 and 10' is to be seen in that, in the operating device 10' of FIG. 2, the electrode—again, by way of example, realized by a helical spring 38—of the proximity sensor 36 assigned to each pushbutton 28, is arranged outside the area occupied by each pushbutton 28 and respectively by its pushbutton body 26. In other regards, in the embodiment according to FIG. 2, use is made of the same advantages as in the operating devices 10 according to FIG. 1.

LIST OF REFERENCE NUMERALS 10 operating device
10' operating device
12 front panel of operating device
14 front side of front panel
16 rear side of front panel
18 guide element
20 wall of guide element
22 inner side of accommodating area
24 accommodating area in guide element
26 pushbutton body of pushbutton
27 front wall of pushbutton body
28 pushbutton
29 accommodating opening in front panel
30 switch
32 carrier plate
34 electrode of proximity sensor
36 proximity sensor
38 helical spring
39 outer side of guide element
40 contact field on carrier plate
42 evaluation unit
44 function feedback indicator device
46 light sour of function feedback indicator device

The invention claimed is:

1. An operating device, in particular for a vehicle component or generally for a human/machine interface, comprising
a front panel having a front side and a rear side,
at least one pushbutton having a pushbutton body depressible from the front side of the front panel,
a guide element arranged on and/or behind the rear side of the front panel and defining an accommodating area in which the pushbutton body is at least partially accommodated and in which the pushbutton body is guided, and a capacitive proximity sensor comprising an electrode arranged on and/or behind the rear side of the front panel, for detecting an object approaching the pushbutton body, in particular a hand or a finger of a hand, wherein that the electrode is arranged outside the accommodating area of the guide element and outside the pushbutton body.

2. The operating device according to claim 1, wherein the guide element comprises an inner sidefacing towards the accommodating area, and an outer side facing away therefrom, and that the electrode is arranged between the inner side and the outer side of the guide element and/or outside the guide element as well as adjacent thereto and/or adjoining thereto.

3. The operating device according to claim 1, wherein the electrode extends externally around the guide element.

4. The operating device according to claim 1 wherein the front panel comprises an accommodating opening for the pushbutton body of said at least one pushbutton.

5. The operating device according to claim 1 wherein at the rear side of the front panel, the guide element projects from said accommodating opening by a length.

6. The operating device according to claim 1, wherein the electrode extends all the way along the length of the guide element and preferably beyond the guide element.

7. The operating device according to claim 1, wherein by a carrier plate having arranged or formed thereon at least one switch operatively connected to the pushbutton body, and a contact field for electrically contacting the electrode.

8. The operating device according to claim 7, wherein the electrode is formed as a helical spring, as a strip element, as a part- or full-sleeve element or as a film.

9. The operating device according to claim 1, wherein an evaluation unit coupled to the electrode, for outputting an output signal indicating the approach of said object.

* * * * *